(12) United States Patent
Iwai

(10) Patent No.: US 8,674,331 B2
(45) Date of Patent: Mar. 18, 2014

(54) ELECTRONIC APPARATUS AND CONTROL METHOD

(75) Inventor: Takashi Iwai, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 537 days.

(21) Appl. No.: 12/960,361

(22) Filed: Dec. 3, 2010

(65) Prior Publication Data

US 2011/0180686 A1   Jul. 28, 2011

(30) Foreign Application Priority Data

Jan. 22, 2010   (JP) ................................ 2010-012284

(51) Int. Cl.
*H01L 31/14*   (2006.01)

(52) U.S. Cl.
USPC ................. 250/552; 250/559.28; 250/559.29; 356/3.11; 356/3.12

(58) Field of Classification Search
USPC ............... 250/552, 559.28, 559.29; 356/3.11, 356/3.12; 345/77, 84
See application file for complete search history.

(56) References Cited

U.S. PATENT DOCUMENTS

| | | | | |
|---|---|---|---|---|
| 6,628,249 | B1 * | 9/2003 | Kamikawa et al. | 345/44 |
| 7,459,670 | B2 * | 12/2008 | Lewin et al. | 250/221 |
| 8,049,158 | B2 * | 11/2011 | Kosht et al. | 250/225 |
| 2008/0167834 | A1 * | 7/2008 | Herz et al. | 702/150 |
| 2011/0006188 | A1 * | 1/2011 | Lin | 250/201.1 |
| 2011/0019205 | A1 * | 1/2011 | Gerber et al. | 356/615 |

FOREIGN PATENT DOCUMENTS

| | | |
|---|---|---|
| JP | H05-313832 | 11/1993 |
| JP | H06-242911 | 9/1994 |
| JP | 2001-125556 | 5/2001 |
| JP | 2002-131051 | 5/2002 |
| JP | 2004-028882 | 1/2004 |
| JP | 2006-071620 | 3/2006 |
| JP | 2006-163459 | 6/2006 |
| JP | 2006-210974 | 8/2006 |
| JP | 2009-014360 | 1/2009 |
| JP | 2009-169627 | 7/2009 |

OTHER PUBLICATIONS

Notice of Reasons for Rejection mailed by the Japan Patent Office on May 31, 2011 in the corresponding Japanese patent app. No. 2010-012284 in 4 pages.
Notice of Reasons for Rejection mailed by the Japan Patent Office on Feb. 22, 2011 in the corresponding Japanese patent app. No. 2010-012284 in 6 pages.

* cited by examiner

*Primary Examiner* — Seung C Sohn
*Assistant Examiner* — Kevin Wyatt
(74) *Attorney, Agent, or Firm* — Knobbe, Martens, Olson & Bear LLP

(57) ABSTRACT

According to one embodiment, an electronic apparatus includes a proximity sensor, a control module and an adjustment module. The proximity sensor is configured to emit light and to detect reflection of the emitted light. The control module is configured to control an operation of the electronic apparatus, based on an output signal of the proximity sensor. The adjustment module is configured to adjust an intensity of the emitted light by monitoring the output signal of the proximity sensor while varying the intensity of the emitted light, when an event indicating that a detection distance of the proximity sensor is to be adjusted has occurred.

3 Claims, 9 Drawing Sheets

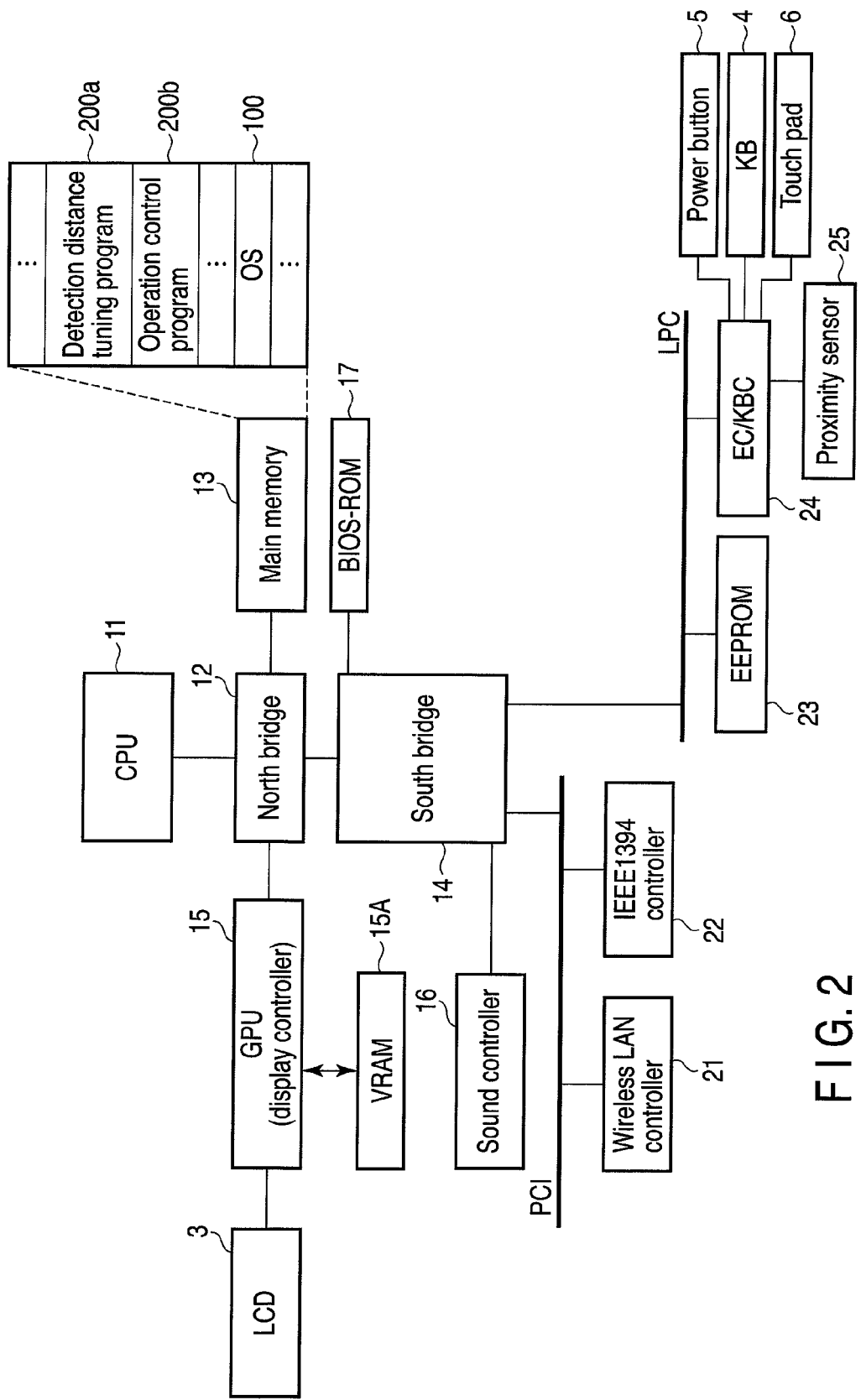
F I G. 2

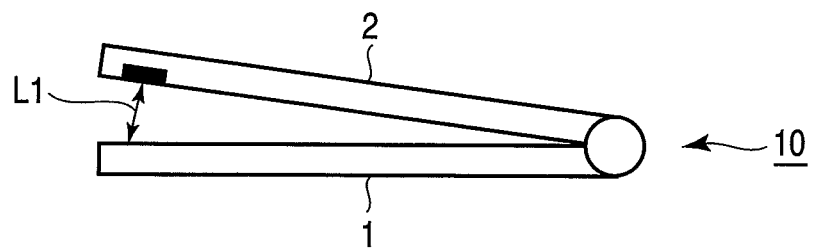
F I G. 13
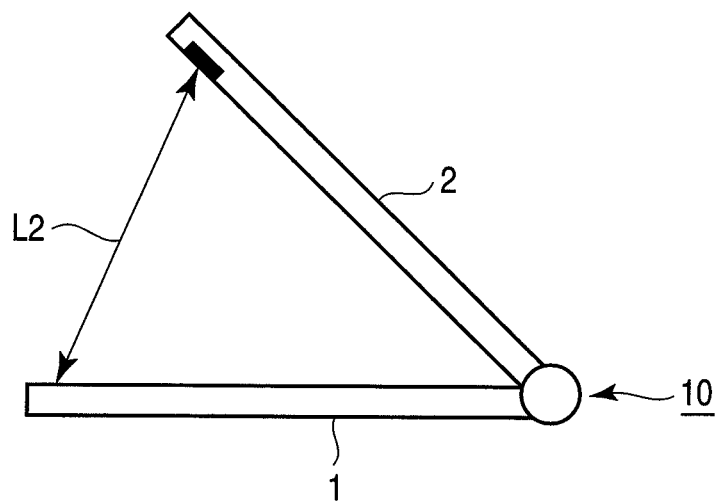
F I G. 14

ELECTRONIC APPARATUS AND CONTROL METHOD

CROSS-REFERENCE TO RELATED APPLICATIONS

This application is based upon and claims the benefit of priority from Japanese Patent Application No. 2010-012284, filed Jan. 22, 2010; the entire contents of which are incorporated herein by reference.

FIELD

Embodiments described herein relate generally to a technique for detecting that an object is present within a range of detection.

BACKGROUND

In general, in electronic apparatuses such as personal computers, PDAs, mobile phones, game machines and TVs, various sensors are used for supporting operations of such electronic apparatuses by the user. A proximity sensor is known as one of such sensors. The proximity sensor is a sensor for detecting an object (e.g. a person) that is present within a range of detection. The proximity sensor can be used in order to detect whether an object which is in proximity to the electronic apparatus is present or not.

Jpn. Pat. Appln. KOKAI Publication No. 2009-169627 discloses a notebook personal computer including a display which is equipped with an infrared sensor. In this computer, the infrared sensor is used in order to determine whether a person, who operates the computer, is present or not.

However, in this computer, no consideration is given to the adjustment of the detection distance (also referred to as "detection range") of the sensor (infrared sensor).

In general, the distance between the user and the computer at a time when the user operates the computer varies from user to user. Even in the case of the same user, the distance between the user and the computer varies depending on the environment of use of the computer (e.g. an environment in which a notebook computer is used on the desk, an environment in which a notebook computer is used on the lap, etc.). Thus, a proper detection distance of the sensor may possibly vary depending on users or the environment of use of the computer.

If the detection distance of the sensor is too short, it is possible that such a situation occurs that the position of the user falls out of the detection range of the sensor, depending on the variation in attitude of the user, even while the user stays in front of the computer.

Conversely, if the distance of detection of the sensor is too long, it is possible that the sensor detects a far object (e.g. a chair, a person passing behind the user's desk, etc.) as a proximity object, despite the user being absent in front of the computer. In this case, although the user is not present in front of the computer, the same operation as when the computer and the user are in a close proximity state may be executed on the computer.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 2 is an exemplary block diagram illustrating a system structure example of the electronic apparatus of the embodiment;

FIG. 13 is an exemplary view illustrating an example of a panel close detection operation of the electronic apparatus of the embodiment; and FIG. 14 is an exemplary view illustrating an example of a panel open detection operation of the electronic apparatus of the embodiment.

DETAILED DESCRIPTION

Various embodiments will be described hereinafter with reference to the accompanying drawings.

In general, according to one embodiment, an electronic apparatus comprises a proximity sensor, a control module and an adjustment module. The proximity sensor is configured to emit light and to detect reflective light of the emitted light. The control module is configured to control an operation of the electronic apparatus, based on an output signal of the proximity sensor. The adjustment module is configured to adjust an intensity of the emitted light by monitoring the output signal of the proximity sensor while varying the intensity of the emitted light, when an event indicating that a detection distance of the proximity sensor is to be adjusted has occurred.

Figure 1:
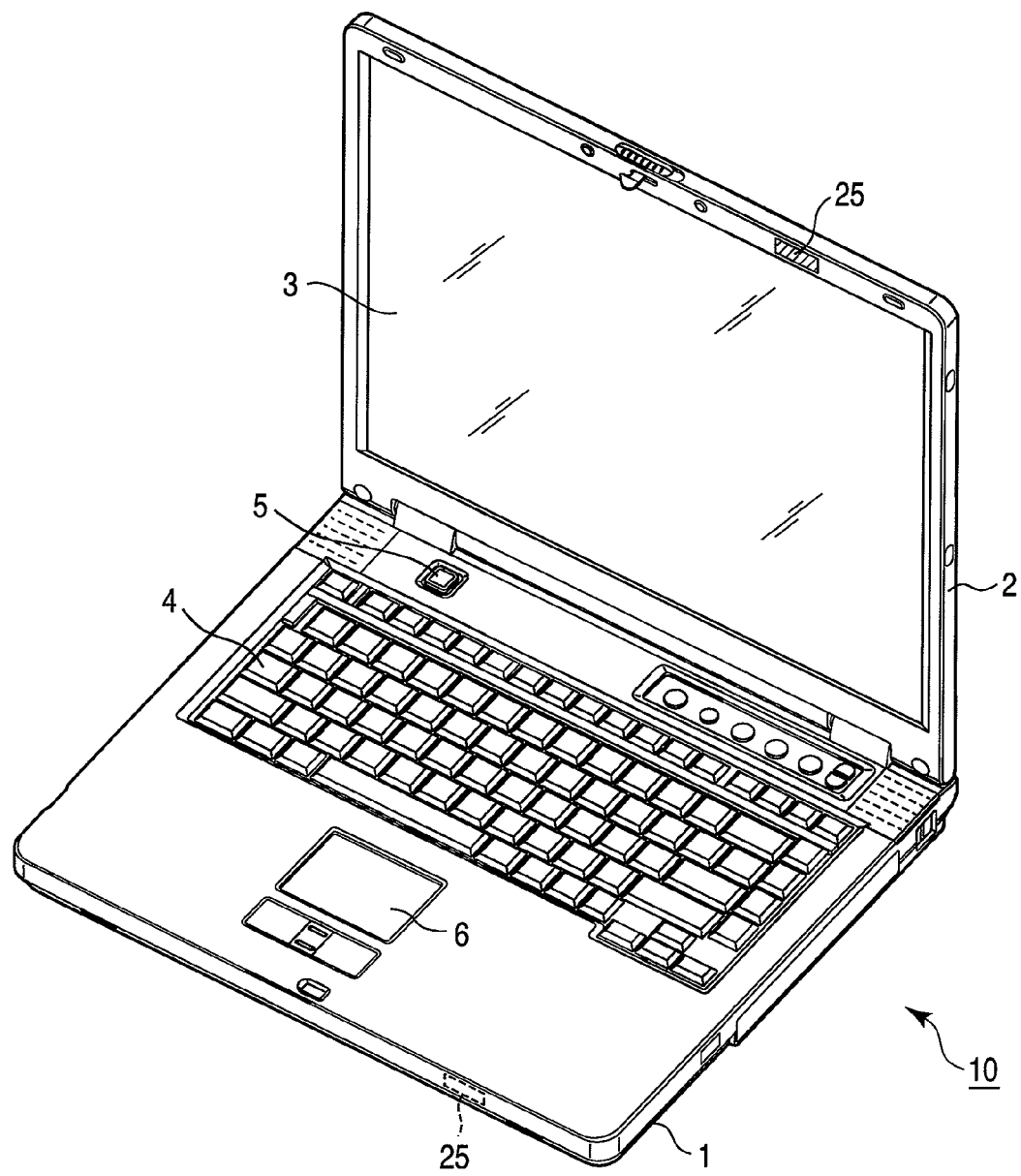
FIG. 1 is an exemplary perspective view illustrating the external appearance of an electronic apparatus according to an embodiment.

FIG. 1 shows the external appearance of an electronic apparatus according to an embodiment. The electronic apparatus is realized, for example, as a battery-powerable portable personal computer 10.

FIG. 1 is a perspective view illustrating the state in which a display unit of the computer 10 is opened. The computer 10 comprises a computer main body 1 and a display unit 2. A liquid crystal display (LCD) 3 is built in the display unit 2. The display screen of the LCD 3 is positioned at an approximately central part of the display unit 2.

The display unit 2 has a thin box-shaped housing, and the display unit 2 is rotatably attached to the computer main body 1 via a hinge module. To be more specific, the display unit 2 is attached to the computer main body 1 so as to be rotatable between an open position where the top surface of the computer main body 1 is exposed and a closed position where the top surface of the computer main body 1 is covered with the display unit 2.

The computer main body 1 is a base unit which has a thin box-shaped casing. A keyboard 4, a power button 5 for powering on/off the computer 10, and a touch pad 6 are disposed on the top surface of the computer main body 1.

The computer 10 further includes a proximity sensor 25. For example, as shown in FIG. 1, the proximity sensor 25 is provided at an upper end portion of the front surface of the display unit 2. Needless to say, the position of the proximity sensor 25 is not limited to the upper end portion of the front surface of the display unit 2. For example, as indicated by a broken line in FIG. 1, the proximity sensor 25 may be disposed on the front surface of the computer main body 1. The proximity sensor 25 is a sensor for detecting an object (e.g. a person) in proximity to the computer 10. The proximity sensor 25 is composed of an optical sensor, and is configured to emit light and detect reflective light of the emitted light. For example, when a user is present at a near position, for example, immediately in front of the computer 10, the light emitted from the proximity sensor 25 (also referred to as "output light") is reflected by the user, and thus the proximity sensor 25 can detect reflective light from the user. The proximity sensor 25 outputs an output signal indicative of a detection result of the reflective light. Using the output signal from the proximity sensor 25, the computer 10 can detect whether the user is present at a position in proximity to the computer 10. The detection result can be used for various operation controls of the computer 10. For example, if it is detected that the user is not present at a position close to the computer 10, a screen saver program may automatically be started. If it is detected that the user is present at a position close to the computer 10 while the screen saver program is running, the screen saver program may automatically be terminated.

Referring to FIG. 2, the system configuration of the computer 10 is described. As shown in FIG. 2, the computer 10 includes a CPU 11, a north bridge 12, a main memory 13, a south bridge 14, a graphics processing unit (GPU) 15, a video memory (VRAM) 15A, a sound controller 16, a BIOS-ROM 17, a wireless LAN controller 21, an IEEE 1394 controller 22, an EEPROM (Electrically Erasable Programmable ROM) 23, EC/KBC 24, and proximity sensor 25. Further, the computer 10 may include a LAN controller, a hard disk drive (HDD), and an optical disc drive (ODD).

The CPU 11 is a processor which controls the operation of the computer 10. The CPU 11 executes an operating system 100 and various application programs, which are loaded from the HDD into the main memory 13. The CPU 11 also executes a BIOS that is stored in the BIOS-ROM 17.

The application programs include a detection distance tuning program 200a. The detection distance tuning program 200a is a program for adaptively controlling a detection distance (also referred to as "detection range") of the proximity sensor 25 in accordance with the user or the environment of use of the computer 10 by the user. The detection distance of the proximity sensor 25 varies in accordance with the intensity of light which is emitted from the proximity sensor 25. Thus, the detection distance tuning program 200a adjusts the intensity of light which is emitted from the proximity sensor 25, thereby optimizing the detection distance of the proximity sensor 25. A tuning process (light intensity adjusting process) by the detection distance tuning program 200a is executed in the state in which the user is actually present in front of the computer 10. In the tuning process, the detection distance tuning program 200a monitors the output signal of the proximity sensor 25, while varying the intensity (output light intensity) of light emitted from the proximity sensor 25. Based on the result of monitoring, the detection distance tuning program 200a adjusts the intensity of emitted light at a value which is proper to the present distance between the computer 10 and the user. For example, the detection distance tuning program 200a gradually increases the intensity of the output light from zero, and sets the output light intensity at a time when a reflection signal is detected by the proximity sensor 25 to be the output light intensity (also referred to as "threshold") that is to be used for the detection of a proximity object. After the tuning process, the proximity sensor 25 emits light of the set output light intensity.

The terms "light intensity" and "intensity of light" used in this specification refer to the strength of light, and in this sense the term "luminous intensity" is equivalent the terms "light intensity" and "intensity of light".

The tuning process is started when an event indicating that the detection distance of the proximity sensor is to be adjusted has occurred. As this event, use may be made of the fact that the detection distance tuning program 200a has been started by the user, or the fact that a start button on a message screen, which is provided by the detection distance tuning program 200a, has been pressed. Besides, when the computer 10 is activated, the detection distance tuning program 200a may automatically be started, thereby to start the tuning process.

As has been described above, the distance between the user and the computer 10 varies depending on the attitude of the user or the environment of use of the computer 10 by the user (e.g. an environment in which the computer 10 is used on the desk, an environment in which the computer 10 is used on the lap, etc.). According to the tuning process of the embodiment, the detection distance of the proximity sensor 25 can be set at a value that is proper to the attitude of the user or the environment of use of the computer 10 by the user. It is possible, therefore, to prevent such a situation from occurring that the position of the user falls out of the detection range due to the variation in attitude of the user, despite the user being in front of the computer 10. Furthermore, it is possible to adequately reduce the possibility that a far different object (e.g. a chair, a person passing behind the user's desk, etc.) is detected as a proximity object, despite the user being absent in front of the computer 10.

The application programs also include an operation control program 200b. The operation control program 200b is a program which controls the operation of the computer 10, based on the output signal of the proximity sensor 25. The operation control program 200b executes, for example, a process of starting/ending the above-described screen saver program, according to whether the user is present at a position close to the computer 10.

The north bridge 102 operates as a bridge device which connects the CPU 11 and the south bridge 14, and also operates as a memory controller which access-controls the main memory 13. The north bridge 12 has a function of communicating with the GPU 15.

The GPU 15 is a display controller which controls the LCD 3. The GPU 15 includes an accelerator which renders, in place of the CPU 11, images which are to be displayed by various application programs. The south bridge 14 controls the devices on a PCI (Peripheral Component Interconnect) bus and the devices on an LPC (Low Pin Count) bus. The south bridge 14 includes an IDE (Integrated Device Electronics) controller for controlling the HDD and ODD. The south bridge 14 also includes a function of communicating with the sound controller 16. The sound controller 16 is a sound source device, and outputs audio data, which is to be reproduced by various applications, to speakers, etc.

The LAN controller is a wired communication device which executes wired communication of, e.g. IEEE 802.3 standard. On the other hand, the wireless LAN controller 21 is a wireless communication device which executes wireless communication of, e.g. IEEE 802.11 standard. The IEEE 1394 controller 22 executes communication with an external device via a serial bus of, e.g. IEEE 1394 standard.

The EC/KBC 24 is a one-chip microcomputer in which an embedded controller for power management and a keyboard controller for controlling the keyboard (KB) 4 and touch pad 6 are integrated. The EC/KBC 24 has a function of controlling the proximity sensor 25. The proximity sensor 25, as described above, is a sensor which detects the presence/absence of an object.

Figure 3:
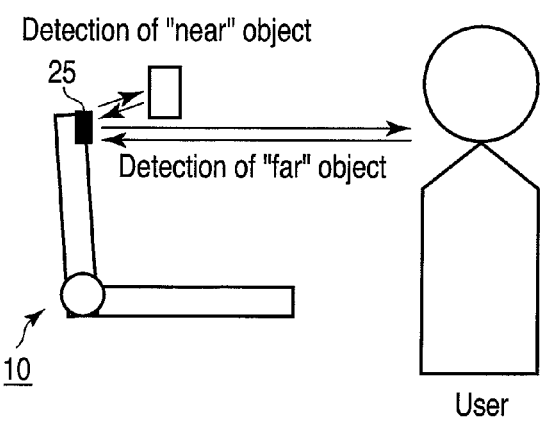
FIG. 3 is an exemplary view for describing an object detection operation which is executed by using a proximity sensor which is provided on the electronic apparatus of the embodiment.

The proximity switch 25 can switch, under the control of the EC/KBC 24, the intensity of emitted light in a time-division manner between a first intensity level for detecting whether an object is present within a first detection distance ("near" distance) from the computer 10 and a second intensity level for detecting whether an object is present within a second detection distance ("far" distance) from the computer 10, which is longer than the first detection distance. Thereby, the proximity sensor 25 can support two detection distances corresponding to the "near" distance and "far" distance, respectively. Specifically, as shown in FIG. 3, the proximity sensor 25 can detect an object which is present at the "near" distance and an object which is present at the "far" distance, while recognizing the difference between the distances.

Figure 4:
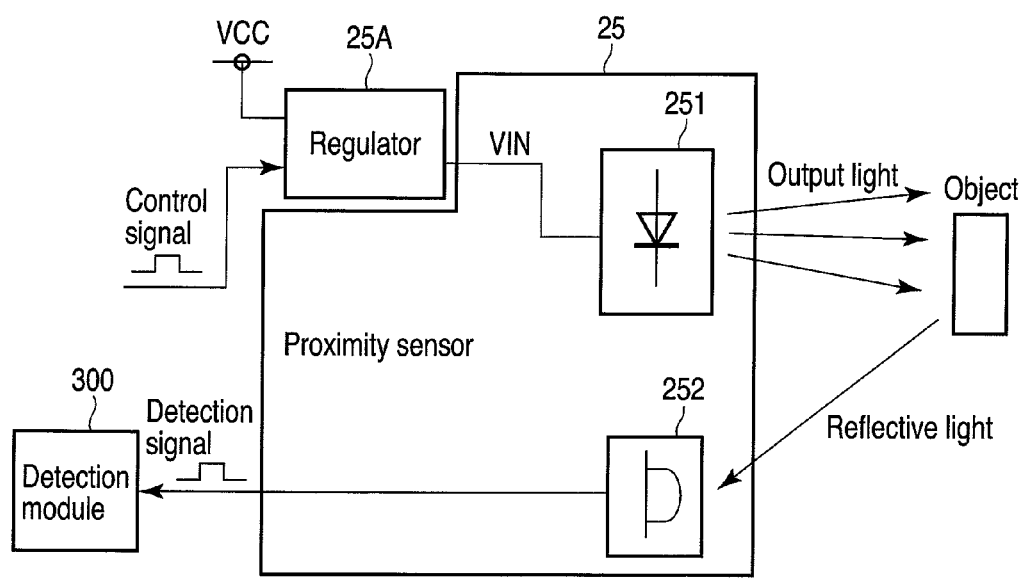
FIG. 4 is an exemplary block diagram illustrating a structure example of the proximity sensor which is provided on the electronic apparatus of the embodiment.

FIG. 4 is a block diagram showing the structure of the proximity sensor 25 and its peripheral components. As shown in FIG. 4, the proximity sensor 25 is composed of a pair of a light emission element 251 and a light reception element 252. The light emission element 251 is a light emission module which emits light, and may be composed of an infrared output LED (Light Emitting Diode). The light reception element 252 is a light detection module which detects reflective light of the light which has been emitted from the light emission element 251.

A regulator 25A for controlling a driving voltage, which is supplied to the light emission element 251, is provided between the EC/KBC 24, which controls the proximity sensor 25, and the proximity sensor 25. By switching the control signal which is supplied to the regulator 25A, the EC/KBC 24 can vary the emission light intensity of the light emission element 251. The light reception element 252 outputs, as a detection signal (also referred to as "output signal"), a light reception condition of the reflective light of the light which is emitted by the light emission element 251, and a detection module 300 in the EC/KBC 24 can detect the presence/absence of a proximity object, based on the detection signal.

As has been detected above, the proximity sensor 25 can switch the emission light intensity (output light intensity) of the light emission element 251 between the first intensity level and the second intensity level in a time-division manner. In this case, the detection module 300 detects whether an object is present within the "near" distance from the computer 10, based on the output signal (detection signal) that is obtained from the proximity sensor 24 during a period in which the light of the first intensity level is being emitted, and also detects whether an object is present within the "far" distance from the computer 10, based on the output signal (detection signal) that is obtained from the proximity sensor 24 during a period in which the light of the second intensity level is being emitted.

Figure 5:
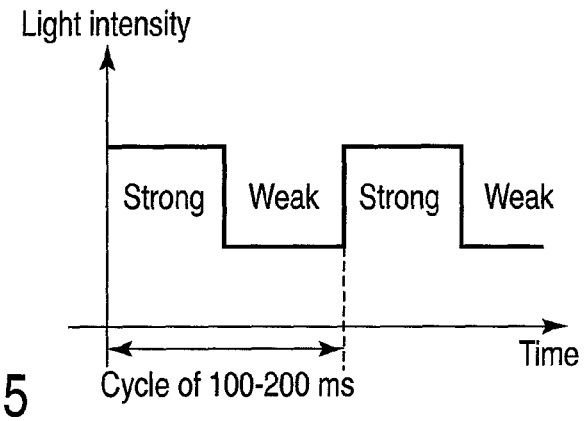
FIG. 5 is an exemplary view illustrating a state in which the intensity level of light, which is emitted from the proximity sensor provided on the electronic apparatus of the embodiment, is varied in a time-division manner.
Figure 6:
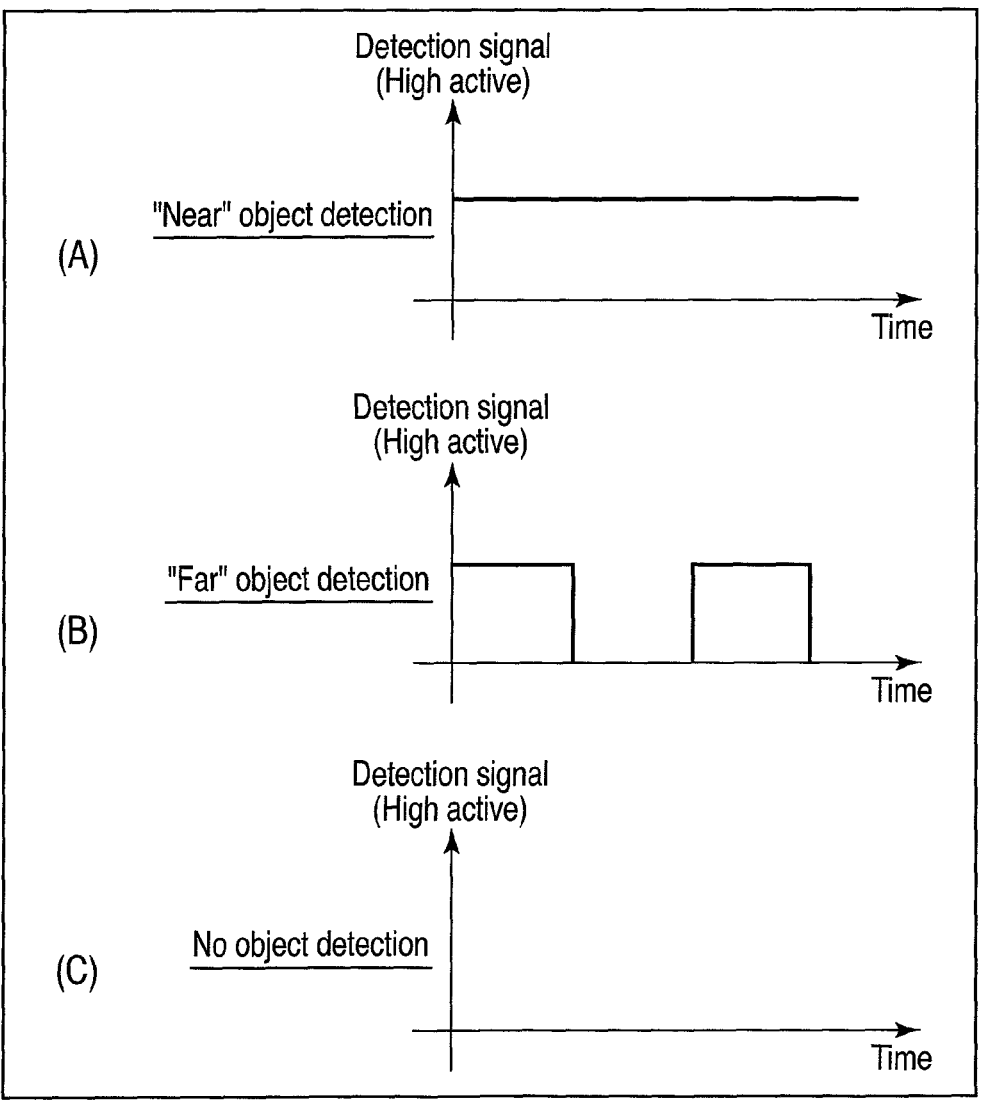
FIG. 6 illustrates examples of output signals which are obtained from the proximity sensor provided on the electronic apparatus of the embodiment.

Next, referring to FIG. 5 and FIG. 6, the operational principle of object detection using the proximity sensor 25 is explained.

The EC/KBC 24 switches the intensity of light emitted from the proximity sensor 25 between the first intensity level and second intensity level in a time-division manner. To be more specific, the EC/KBC 24 first switches the control signal which is input to the regulator 25A, thereby switching the value of the driving voltage which is supplied from the regulator 25A to the light emission element 251 so that the amount of emission light of the light emission element 251 may vary between "strong" and "weak" in a time-division manner within a fixed cycle of, e.g. 100 ms to 200 ms, as shown in FIG. 5.

At the time of "weak", only reflective light from an object that is present in the "near" distance is detected by the light reception element 252, and reflective light from an object that is present in the "far" distance is not detected by the light reception element 252. At the time of "strong", both the reflective light from an object that is present in the "near" distance and the reflective light from an object that is present in the "far" distance are detected by the light reception element 252.

The EC/KBC 24 monitors the detection signal which is output from the light reception element 252, in synchronism with the switching of the control signal which is input to the regulator 25A. Since the EC/KBC 24 adjusts the control signal which is input to the regulator 25A, as described above, the EC/KBC 24 detects, based on the patterns of the detection signal as shown in FIG. 6, the case in which an object is present in the "near" distance, the case in which an object is present in the "far" distance, and the case in which no object is present either in the "near" distance or in the "far" distance.

In FIG. 6, part (A) shows a pattern of the detection signal which is output from the proximity sensor 25 when an object is present in the "near" distance, part (B) shows a pattern of the detection signal which is output from the proximity sensor 25 when an object is present in the "far" distance, and part (C) shows a pattern of the detection signal which is output from the proximity sensor 25 when no object is present (no object is present either in the "near" distance or in the "far" distance).

For example, when an active detection signal is detected at the time of light intensity "weak", the detection module 300 determines that an object in the "near" distance has been detected. When an active detection signal is not detected at the time of light intensity "weak" and an active detection signal is detected at the time of light intensity "strong", the detection module 300 determines that an object in the "far" distance has been detected. When an active detection signal is not detected at the time of light intensity "weak" and an active detection signal is not detected at the time of light intensity "strong", the detection module 300 determines that no object is present.

By using the two detection distances, the detection module 300 can detect the presence of the user in front of the computer 10 as the presence of an object of the "far" distance, and can detect the presence of the user's hand that is held in front of the display unit 2 as the presence of an object of the "near" distance. Based on the detection result of the detection module 300, the operation control program 200b can control, for example, the start and end of the screen saver program in accordance with detection/non-detection of an object of the "far" distance, and can control the start of another specified application when an object of the "near" distance is detected.

Figure 7:
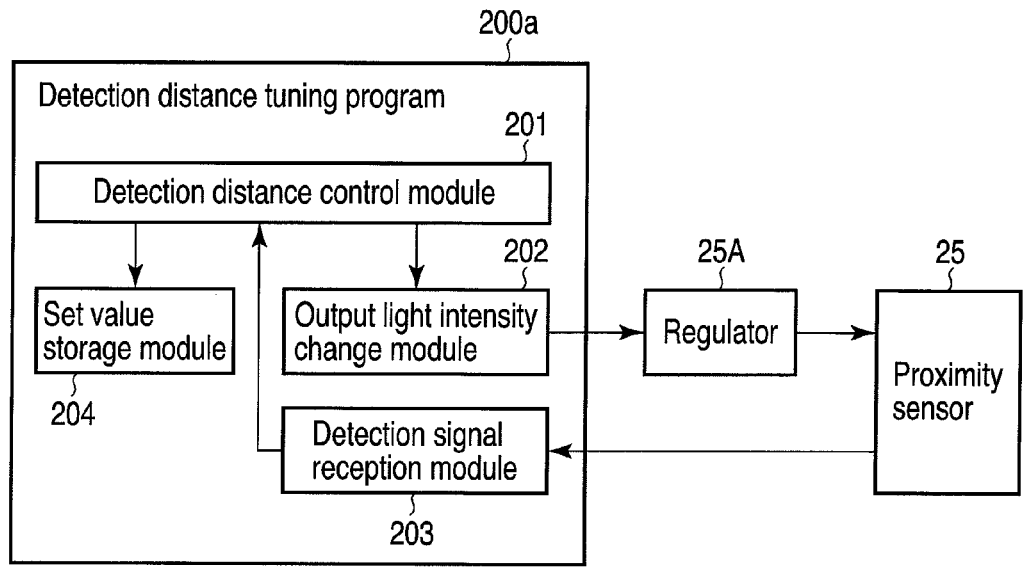
FIG. 7 is an exemplary block diagram illustrating a structure example of a detection distance tuning program which is used by the electronic apparatus of the embodiment.

Next, referring to FIG. 7, the functional structure of the detection distance tuning program 200a is described. The detection distance tuning program 200a comprises a detection distance control module 201, an output light intensity change module 202, a detection signal reception module 203, and a set value storage module 204. The detection distance control module 201 executes a tuning process for adjusting the detection distance (output light intensity) of the proximity sensor 25, by using the output light intensity change module 202 and detection signal reception module 203. Under the control of the detection distance control module 201, the output light intensity change module 202 successively changes the output light intensity of the proximity sensor 25 via the EC/KBC 24. The detection signal reception module 203 receives the detection signal of the proximity sensor 25 via the EC/KBC 24. The detection distance control module 201 monitors the detection signal of the proximity sensor 25 with use of the detection signal reception module 203, while successively changing the output light intensity with use of the output light intensity change module 202. Based on the result of monitoring, the detection distance control module 201 determines the output light intensity of the proximity sensor 25. The set value storage module 204 sets in the EC/KBC 24 the value of the control signal corresponding to the determined output light intensity, and stores the information indicative of the determined output light intensity in the storage device (e.g. EEPROM 23, HDD, etc.).

Figure 8:
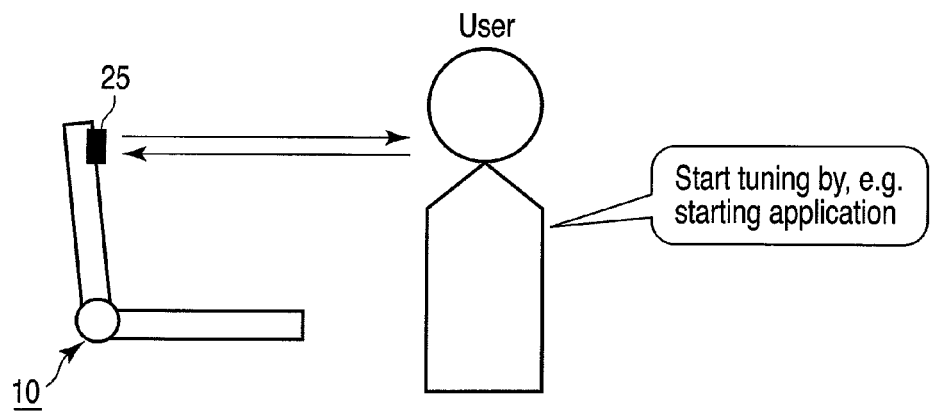
FIG. 8 is an exemplary view illustrating a state in which a detection distance tuning operation, which is executed by the electronic apparatus of the embodiment, is being executed.

As shown in FIG. 8, the tuning operation by the detection distance tuning program 200a is executed in the state in which the user is present in front of the computer 10. In the tuning operation, reflective light from the user is actually detected.

Figure 9:
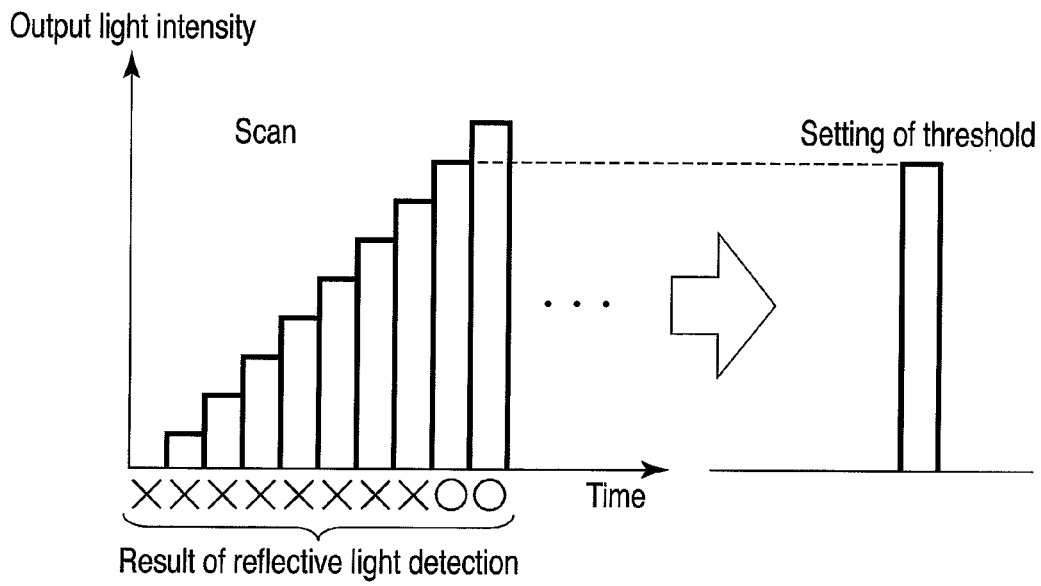
FIG. 9 is an exemplary view illustrating an example of a reflective light detection result which is obtained by the detection distance tuning operation which is executed by the electronic apparatus of the embodiment.

FIG. 9 shows an example of the reflective light detection result which is obtained by the tuning operation. In FIG. 9, "x" mark indicates that no active detection signal has been output from the proximity sensor 25, and "o" mark indicates that an active detection signal has been output from the proximity sensor 25.

The detection distance tuning program 200a successively increases the output light intensity, for example, from zero in units of a predetermined value (scan). If the output light intensity increases to a certain level, it becomes possible for the light reception element 252 of the proximity sensor 25 to detect reflective light from the user, and the proximity sensor 25 outputs an active detection signal. The detection distance tuning program 200a stores, as an output light intensity (threshold) to be used for detecting a proximity object, the value of the output light intensity at the time when the active detection signal is output from the proximity sensor 25. Thereby, for example, the minimum value, or a value in the neighborhood of the minimum value, of the output light intensity, with which the proximity sensor 25 can detect the reflective light, is stored as the output light intensity that is to be used for detecting the proximity object. When the proximity sensor 25 is used thereafter, the output light intensity of the proximity sensor 25 is set at the stored value.

Instead of increasing the output light intensity from zero, it is possible to set the output light intensity at a certain default value. If an active detection signal from the proximity sensor 25 is detected when light of the output light intensity of the default value is emitted, the detection distance tuning program 200a gradually decreases the output light intensity from the default value until the active detection signal is no longer detected. Conversely, if an active detection signal from the proximity sensor 25 is not detected when light of the output light intensity of the default value is emitted, the detection distance tuning program 200a gradually increases the output light intensity from the default value until an active detection signal is detected.

Figure 10:
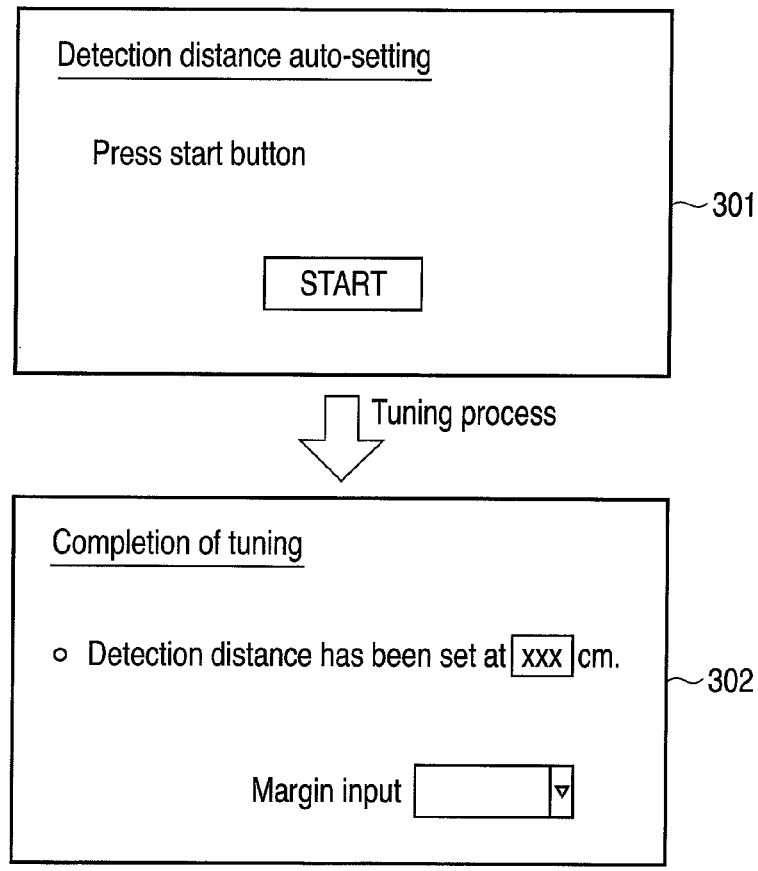
FIG. 10 is an exemplary view illustrating an example of a graphical user interface which is displayed by the detection distance tuning program which is used by the electronic apparatus of the embodiment.

FIG. 10 shows an example of a GUI which is displayed on the LCD 3 by the detection distance tuning program 200a. When the detection distance tuning program 200a has been started, the detection distance tuning program 200a notifies the user of a message indicating the start of adjustment of the detection distance. This message is used in order to notify the user that the user should be in a position to operate the computer 10, that is, the user should be in a position which is away from the surface of the computer 10 by a distance which is to be set as the detection distance. For example, the detection distance tuning program 200a displays a message screen 301 on the LCD 3, thereby notifying the user of a message indicating the start of adjustment of the detection distance. The message screen 301 includes a start button. When the start button has been clicked by the user's operation of an input device such as the touch pad 6, that is, when an event, which indicates that the detection distance of the proximity sensor is to be adjusted, has occurred, the detection distance tuning program 200a starts the above-described tuning operation (scan).

If the tuning operation has been completed, the detection distance tuning program 200a displays a message screen 302 on the LCD 3. The message screen 302 displays a detection distance which is converted from the set output light intensity. Further, the message screen 302 displays a pull-down menu for inputting a margin. By manipulating the pull-down menu, the user can select, for example, one of two margin levels, "large" and "middle". If the margin level of "middle" is selected, the detection distance tuning program 200a sets a value, which is higher by, e.g. 1 level than the output light intensity determined by the tuning (scan), to be the output light intensity that is to be used for detecting a proximity object. If the margin level of "large" is selected, the detection distance tuning program 200a sets a value, which is higher by, e.g. 2 levels than the output light intensity determined by the tuning (scan), to be the output light intensity that is to be used for detecting a proximity object.

Figure 11:
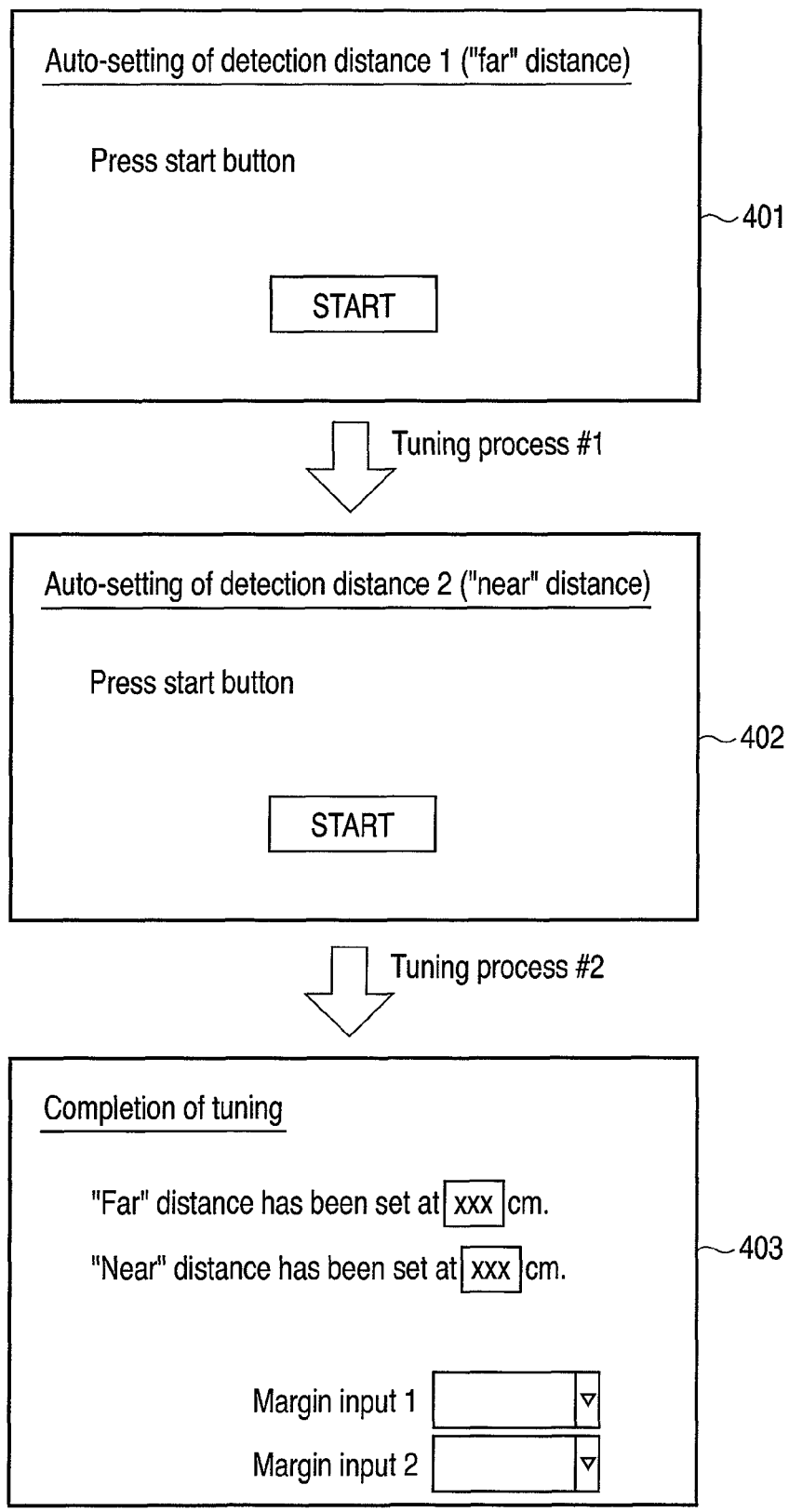
FIG. 11 is an exemplary view illustrating another example of the graphical user interface which is displayed by the detection distance tuning program which is used by the electronic apparatus of the embodiment.

FIG. 11 shows another example of a GUI which is displayed on the LCD 3 by the detection distance tuning program 200a. The GUI of FIG. 11 is adaptive to a proximity sensor which supports two detection distances.

When the detection distance tuning program 200a has been started, the detection distance tuning program 200a first notifies the user of a message indicating the start of adjustment of the detection distance corresponding to, for example, a "far" distance. This message is used in order to notify the user that the user should be in a position to operate the computer 10, that is, the user should be in a position which is away from the surface of the computer 10 by a distance which is to be set as the "far" distance. For example, the detection distance tuning program 200a displays a message screen 401 on the LCD 3, thereby notifying the user of a message indicating the start of adjustment of the "far" distance. The message screen 401 includes a start button. When the start button has been clicked by the user's operation of an input device such as the touch pad 6, that is, when an event, which indicates that the "far" distance of the proximity sensor is to be adjusted, has occurred, the detection distance tuning program 200a starts the above-described tuning operation (scan).

If the tuning operation has been completed, the detection distance tuning program 200a notifies the user of a message indicating the start of adjustment of the detection distance corresponding to, for example, a "near" distance. This message is used in order to notify the user that the user should hold an object, such as the hand, at a position which is away from the surface of the computer 10 by a distance which is to be set as the "near" distance. For example, the detection distance tuning program 200a displays a message screen 402 on the LCD 3, thereby notifying the user of a message indicating the start of adjustment of the "near" distance. The message screen 402, too, includes a start button. When the start button has been clicked by the user's operation of the input device such as the touch pad 6, that is, when an event, which indicates that the "near" distance is to be adjusted, has occurred, the detection distance tuning program 200a starts the above-described tuning operation (scan).

If the tuning operation has been completed, the detection distance tuning program 200a displays a message screen 403 on the LCD 3. The message screen 403 displays detection distances corresponding to the "far" distance and "near" distance, which are converted from the two set output light intensity. Further, the message screen 403 displays a pull-down menu for inputting a margin for the "far" distance and a pull-down menu for inputting a margin for the "near" distance.

In this example, the tuning of the detection distance corresponding to the "near" distance is executed after the tuning of the detection distance corresponding to the "far" distance is executed. Alternatively, the tuning of the detection distance corresponding to the "near" distance may first be executed, and then the tuning of the detection distance corresponding to the "far" distance may be executed.

Figure 12:
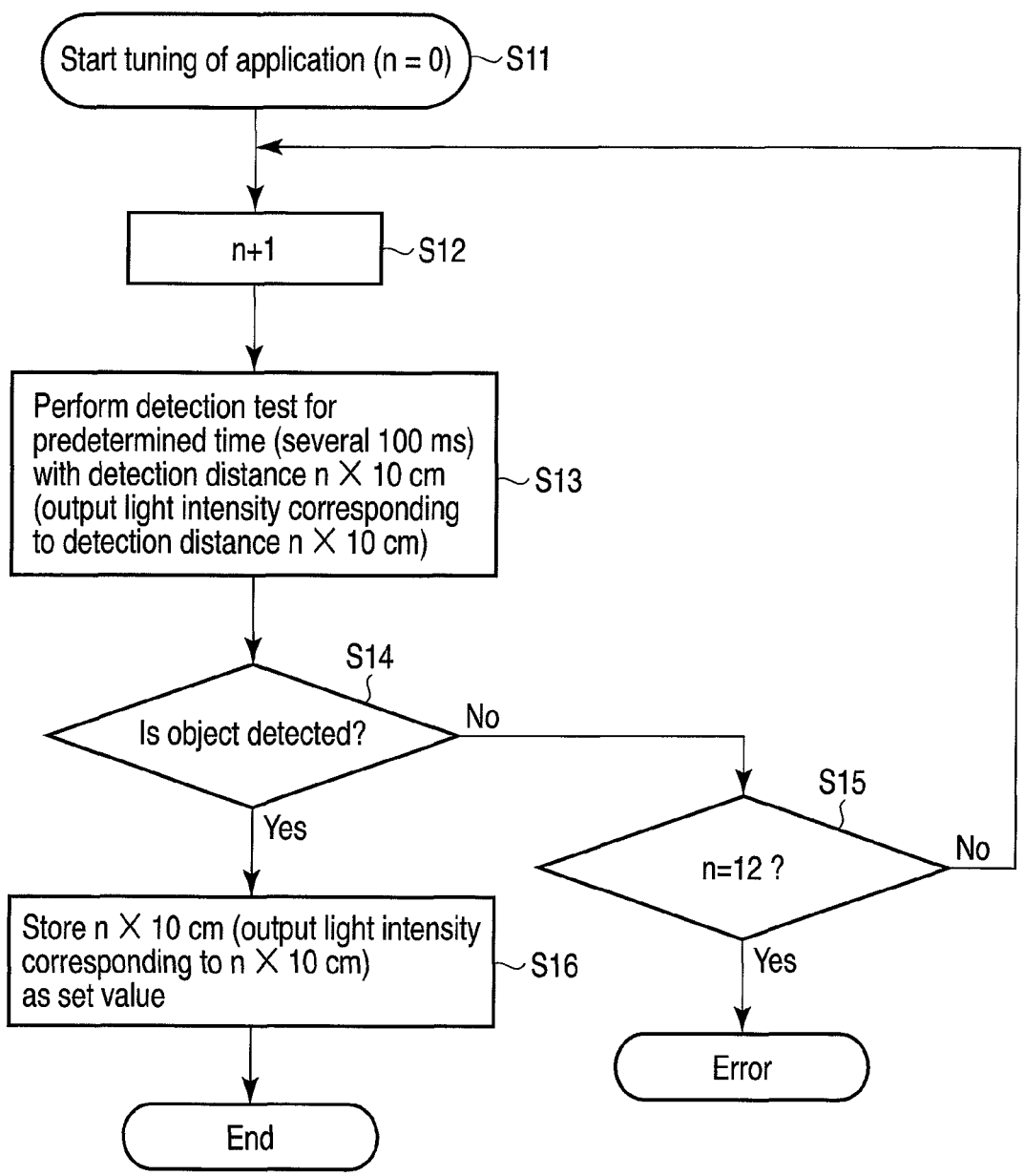
FIG. 12 is an exemplary flow chart illustrating an example of the procedure of a detection distance tuning process which is used in the electronic apparatus of the embodiment.

Next, referring to a flow chart of FIG. 12, the procedure of the tuning operation is described.

For example, the case is assumed in which use is made of a proximity sensor which can vary the detection distance in units of 10 cm, with the maximum detection distance being set at 120 cm (i.e. a sensor capable of adjusting the output light intensity in 12 steps). The output light intensities corresponding to the 12 detection distances (10 cm, 20 cm, . . . , 120 cm) are preset. The detection distance at a certain time point (converted from the output light intensity) is expressed by n×10 cm. In this case, n is any one of counting numbers of 0 to 12. In the tuning operation, the default value of n is 0. The procedure of the tuning operation is as follows.

(1) To start with, the detection distance tuning program 200a initially sets the detection distance (i.e. the output light intensity) (step S11). Then, the detection distance tuning program 200a performs a detection test for a fixed time (several 100 ms) with the detection distance of n×10 cm (i.e. with the output light intensity corresponds to the detection distance of n×10 cm) (step S13). In step S13, a process of emitting light of the output light intensity corresponding to the detection distance of n×10 cm and a process for detecting reflective light are executed.

(2) If no object is detected, that is, if no reflective light is detected (NO in step S14), the detection distance tuning program 200a checks the present value of n (step S15). If n<12 (NO in step S15), the detection distance tuning program 200a counts up n by +1 (step S12), and advances to step S13. If n=12 (YES in step S15), the detection distance tuning program 200a returns "detection error" (no object has been detected within the maximum detection distance) and finishes the process.

(3) If an object is detected, that is, if reflective light is detected (YES in step S14), the detection distance tuning program 200a stores the output light intensity, which corresponds to the present detection distance, n×10 cm, as the output light intensity which is used in the proximity object detection process hereafter (step S16).

Assume now the case in which the tuning operation has been executed in the state in which the distance between the user and the computer 10 is 55 cm. In this case, an object (the user in this case) is not detected up to n=5, and an object is detected when n is counted up to n=6. The output light intensity corresponding to 60 cm is stored as the output light intensity which is used in the proximity object process, and the tuning operation is finished. After the tuning, it is determined, from the output signal of the proximity sensor 25, whether an object is present within the distance of 60 cm from the computer 10. If an object is detected within the distance of 60 cm from the computer 10, the detection module 300 determines that "a person is present in front of the computer". On the other hand, if no object is detected within the distance of 60 cm from the computer 10, the detection module 300 determines that "nobody is present in front of the computer".

Once the tuning has been executed, the proximity object detection process is executed by using the same output light intensity, until the next tuning is executed.

If the proximity sensors 25 supports two detection distances, the above-described tuning operation is executed with respect to the two detection distances. Thereby, both the "near" distance and "far" distance can be optimized. In particular, since the proper value of the "near" distance varies greatly depending on the user or the environment of use of the computer, it is effective to execute the above-described tuning operation with respect to the two detection distances.

Another example of the application, which uses the proximity sensor 25 supporting the two detection distances, is an LCD panel open/close detection system which detects open/close of the display panel 2.

As shown in FIG. 13 and FIG. 14, the usability is improved if the detection distance at a time when the display panel is opened and the detection distance at a time when the display panel is closed can separately be set. For example, if a detection distance L1 (FIG. 13) at the time of closing is set to be short and a detection distance L2 (FIG. 14) at the time of opening is set to be long, hysteresis characteristics can be realized and the usability can be improved.

The tuning operation for the detection distance L1 and the tuning operation for the detection distance L2 are executed by the same procedure as illustrated in FIG. 12. For example, the case is assumed in which use is made of a proximity sensor which can vary the detection distance in units of 3 cm, with the maximum detection distance being set at 30 cm (i.e. a sensor capable of adjusting the output light intensity in 10 steps).

After starting the detection distance tuning program 200a, the user rotates the display unit 2 in a direction of closing and inclines the display unit 2 up to an angle corresponding to the position which is to be set as the detection distance L1 at the time of closing (the state shown in FIG. 13). In this case, it is assumed that the distance between the display unit 2 and the main body 1 is 5 cm. The detection distance tuning program 200a starts the tuning operation. Since the user cannot view the display screen in the state in which the display unit 2 is inclined, a voice guidance may be used in place of the GUI which has been described with reference to FIG. 10 and FIG.

11. Besides, by using a timer, the tuning operation may automatically be started after the passing of a predetermined period from a certain time point.

In the tuning operation, an object (main body 1 in this case) is not detected up to n=1, and an object is detected when n is counted up to n=2. Then, the output light intensity corresponding to 6 cm is stored.

Subsequently, the user rotates the display unit 2 in a direction of opening and inclines the display unit 2 up to an angle corresponding to the position which is to be set as the detection distance L2 at the time of opening (the state shown in FIG. 14). In this case, it is assumed that the distance between the display unit 2 and the main body 1 is 22 cm. The detection distance tuning program 200a starts the tuning operation. In the tuning operation, an object is detected when n=8, and the output light intensity corresponding to 24 cm is stored.

In this manner, the tuning of the detection distance at the time of closing and at the time of opening is completed. After the tuning, if an object is detected within the distance of 6 cm while the display panel 2 in an open state is being moved, that is, if an object is detected within the "near" distance, it is recognized that "the LCD panel has been closed". If the object is no longer detected within the distance of 24 cm while the panel 2 is being moved from the closed state, that is, if the object detection result corresponding to the "far" distance has changed from "detection" to "non-detection", it is recognized that the "LCD panel has been opened". If it is recognized that "the LCD panel has been closed", a process for a transition to a sleep state, for example, is executed. If it is recognized that "the LCD panel has been opened", a process of wakeup, for example, is executed.

As has been described above, according to the present embodiment, the intensity (output light intensity) of light emitted from the proximity sensor 25 is adjusted in response to the occurrence of an event instructing the adjustment of the detection distance of the proximity sensor, and thereby the intensity of emitted light is set at a value that is proper to the present actual positional relationship between the computer 10 and the object (e.g. the user). Thus, the intensity of light emitted from the proximity sensor 25 can be set at a value which is proper to the attitude of the user or the environment of use of the computer 10 by the user, and therefore the precision of detection of a proximity object can be improved.

Although the computer has been described by way of example in the embodiment, the detection distance tuning function of the embodiment can be applied to various portable electronic apparatuses such as a PDA, a mobile phone and a game machine. In addition, the embodiment is applicable not only to a portable electronic apparatus, but also to a relatively large electronic apparatus (e.g. a TV).

The tuning function of the embodiment is realized by a computer program. Thus, the same advantageous effects as with the present embodiment can easily be obtained simply by installing the computer program into a computer including a proximity sensor through a computer-readable storage medium which stores the computer program.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a proximity sensor configured to emit light and to detect reflection of the emitted light;
   a light intensity control module configured to switch an intensity of the emitted light in a time-division manner between a first intensity level and a second intensity level which is higher than the first intensity level;
   a detection module configured to detect, based on an output signal of the proximity sensor while light of the first intensity level is being emitted, whether an object is present within a first detection distance from the electronic apparatus, and to detect, based on an output signal of the proximity sensor while light of the first intensity level is being emitted and an output signal of the proximity sensor while light of the second intensity level is being emitted, whether an object is present within a second detection distance from the electronic apparatus, the second detection distance being longer than the first detection distance;
   a control module configured to control an operation of the electronic apparatus, based on a detection result by the detection module; and
   an adjustment module configured to adjust the first and second intensity levels by monitoring the output the proximity sensor while varying the intensity of the emitted light.

2. The electronic apparatus of claim 1, wherein the adjustment module is configured to generate a first message indicating a start of adjustment of the first detection distance to start the adjustment of the first detecting distance after the first message is generated, and to generate a second message indicating a start of adjustment of the second detection distance to start the adjustment of the second detecting distance after the second message is generated.

3. A control method for controlling an operation of an electronic apparatus comprising a proximity sensor configured to emit light and to detect reflection of the emitted light, the control method comprising:
   switching an intensity of the emitted light in a time-division manner between a first intensity level and a second intensity level which is higher than the first intensity level;
   detecting, based on an output signal of the proximity sensor while light of the first intensity level is being emitted, whether an object is present within a first detection distance from the electronic apparatus, and detecting, based on an output signal of the proximity sensor while light of the first intensity level is being emitted and an output signal of the proximity sensor while light of the second intensity level is being emitted, whether an object is present within a second detection distance from the electronic apparatus, the second detection distance being than the first detection distance;
   controlling an operation of the electronic apparatus, based on a detection result indicating whether an object is present within the first detection distance and a detection result indicating whether an object is present within the second detection distance; and
   adjusting the first and second intensity levels by monitoring the output signal of the proximity sensor while varying the intensity of the emitted light, in response to an event indicating that a detection distance of the proximity sensor is to be adjusted.

* * * * *